(12) United States Patent
Odagaki et al.

(10) Patent No.: US 9,521,749 B2
(45) Date of Patent: Dec. 13, 2016

(54) CIRCUIT SUBSTRATE AND ELECTRONIC DEVICE

(71) Applicant: CANON KABUSHIKI KAISHA, Tokyo (JP)

(72) Inventors: Koichi Odagaki, Kawasaki (JP); Shuichi Kato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 212 days.

(21) Appl. No.: 14/453,146

(22) Filed: Aug. 6, 2014

(65) Prior Publication Data

US 2015/0043184 A1    Feb. 12, 2015

(30) Foreign Application Priority Data

Aug. 9, 2013  (JP) .................. 2013-166262

(51) Int. Cl.
*H01L 23/48* (2006.01)
*H05K 1/11* (2006.01)
*H01L 23/49* (2006.01)

(52) U.S. Cl.
CPC ..... *H05K 1/111* (2013.01); *H01L 2924/15313* (2013.01); *H05K 2201/099* (2013.01); *H05K 2201/09381* (2013.01); *Y02P 70/611* (2015.11)

(58) Field of Classification Search
CPC ........................................... H01L 2924/15313

USPC ........................ 174/534, 557; 257/E21.523
See application file for complete search history.

(56) References Cited

U.S. PATENT DOCUMENTS

| 8,216,930 | B2 * | 7/2012 | Pendse .................. | H01L 21/563 438/613 |
| 2005/0013978 | A1 * | 1/2005 | Honda .................. | H05K 3/3447 428/209 |

FOREIGN PATENT DOCUMENTS

JP          2006-303173 A    11/2006

* cited by examiner

*Primary Examiner* — Binh Tran
(74) *Attorney, Agent, or Firm* — Cowan, Liebowitz & Latman, P.C.

(57) ABSTRACT

A circuit substrate which is capable of decreasing the possibility that the amount of solder in the overall mounting land is uneven and reducing formation of a solder void even when a mounting terminal has a large soldering area. An electronic component having the mounting terminal is mounted on the circuit substrate. A mounting land is connected to the mounting terminal of the electronic component by soldering, and the mounting land has a protruding portion of an insulating material formed so as to protrude from an outer side of the mounting land toward an inner side of the mounting land, and the protruding portion does not divide the mounting land into a plurality of areas.

19 Claims, 6 Drawing Sheets

CIRCUIT SUBSTRATE AND ELECTRONIC DEVICE

BACKGROUND OF THE INVENTION

Field of the Invention

The invention relates to a circuit substrate and an electronic device, and in particular, a circuit substrate which is disposed in an electronic device and on which an electronic component is mounted by soldering or the like.

Description of the Related Art

In an electronic device, various electronic components (electronic elements) from an IC to a resistor to a connector are mounted on a circuit substrate, and a method called surface-mounting is widely used to mount these electronic components on the circuit substrate. In surface-mounting, solder is printed on a mounting land of a circuit substrate, an electronic component is mounted on the circuit substrate so that a mounting terminal of the electronic component can be put on the mounting land, and then the solder is melted by heating with a reflow furnace. After the melted solder flows into a space between the mounting land and the mounting terminal, the melted solder is cooled to stick the mounting land provided on the circuit substrate and the mounting terminal of the electronic component together, whereby the electronic component is fixed to the circuit substrate, and at the same time, required electric connection between the electronic component and the circuit substrate is established.

In this surface-mounting, when solder is heated with a reflow furnace printed on a circuit substrate, a flux component contained in the solder vaporizes to generate gas in the solder, and the generated gas remains in the cooled and hardened solder without being discharged from the solder, causing a so-called solder void to be formed. When a solder void is formed, a satisfactory joint strength cannot be obtained at a solder joint, and also, when there is a temperature change, a crack is formed at a solder joint due to the solder void, resulting in further decreasing joint strength.

Moreover, when a solder void is formed, there is fear that the reliability of electric contention between an electronic component and a circuit substrate will decrease. In particular, the greater the soldering area of a mounting terminal, the larger the amount of solder, and the longer the distance from the center of a mounting land to an outer periphery of the mounting land. For this reason, gas generated by vaporization of a flux composition resists being discharged from solder, and a solder void tends to be formed.

Accordingly, there have been proposed various techniques to prevent or reduce formation of a solder void in solder joining by surface-mounting using a mounting terminal with a large soldering area. According to a technique described in, for example, Japanese Laid-Open Patent Publication (Kokai) No. 2006-303173, in a circuit substrate device in which a component electrode of an electric component is soldered to an electrode land formed on a circuit substrate, an area corresponding to the component electrode on the mounting land is divided into a plurality of land areas by a solder resist with a predetermined width. Then, solder disposed in the plurality of land areas electrically and mechanically joins the component electrode to the land areas, and at this time, a gap connecting to outside the component electrode is formed between the solder resist and the component electrode between the land areas.

According to the technique described in Japanese Laid-Open Patent Publication (Kokai) No. 2006-303173, however, because an electrode land is divided into a plurality of areas by a solder resist having a predetermined width, the amount of solder in the plurality of areas is uneven. Particularly in the case of a terminal whose soldering area is large, the amount of solder in a peripheral area tends to be small due to surface tension of the solder. When the amount of solder in the plurality of areas is uneven, joint strength varies with the areas. When solder joint strength in an area where the amount of solder is relatively small thus decreases, satisfactory joint strength at solder joints over the whole electrode land may not be obtained. Moreover, in an area with a small amount of solder, it is feared that the reliability of electric connection will decrease due to high electric resistance.

SUMMARY OF THE INVENTION

The invention provides a circuit substrate and an electronic device, which are capable of, when surface-mounting an electronic component on a circuit substrate, decreasing the possibility that the amount of solder in the entire mounting land is uneven, and reducing the formation of a solder void even in the case of a terminal whose soldering area is large.

Accordingly, an aspect of the invention provides a circuit substrate on which an electronic component having a mounting terminal is mounted, comprising a mounting land configured to be connected to the mounting terminal of the electronic component by soldering, wherein the mounting land is provided with a protruding portion of an insulating material formed so as to protrude from an outer side of the mounting land toward an inner side of the mounting land, and wherein the protruding portion does not divide the mounting land into a plurality of areas.

According to the invention, the protruding portion comprised of an insulating material protruding from an outer side of the mounting land toward an inner side of the mounting land is provided so as not to divide the mounting land into a plurality of areas. As a result, solder voids are less likely to be formed, and also, even in the case of a terminal whose soldering area is large, the amount of solder is less likely to be uneven over the whole mounting land. Consequently, satisfactory solder joint strength can be obtained, and the reliability of electric connection using solder can be improved.

Further features of the invention will become apparent from the following description of exemplary embodiments (with reference to the attached drawings).

DESCRIPTION OF THE EMBODIMENTS

A detailed description will now be given of a circuit substrate according to an embodiment of the invention with particular emphasis on a form of a mounting land provided on the circuit substrate with reference to the accompanying drawings.

Figure 1:
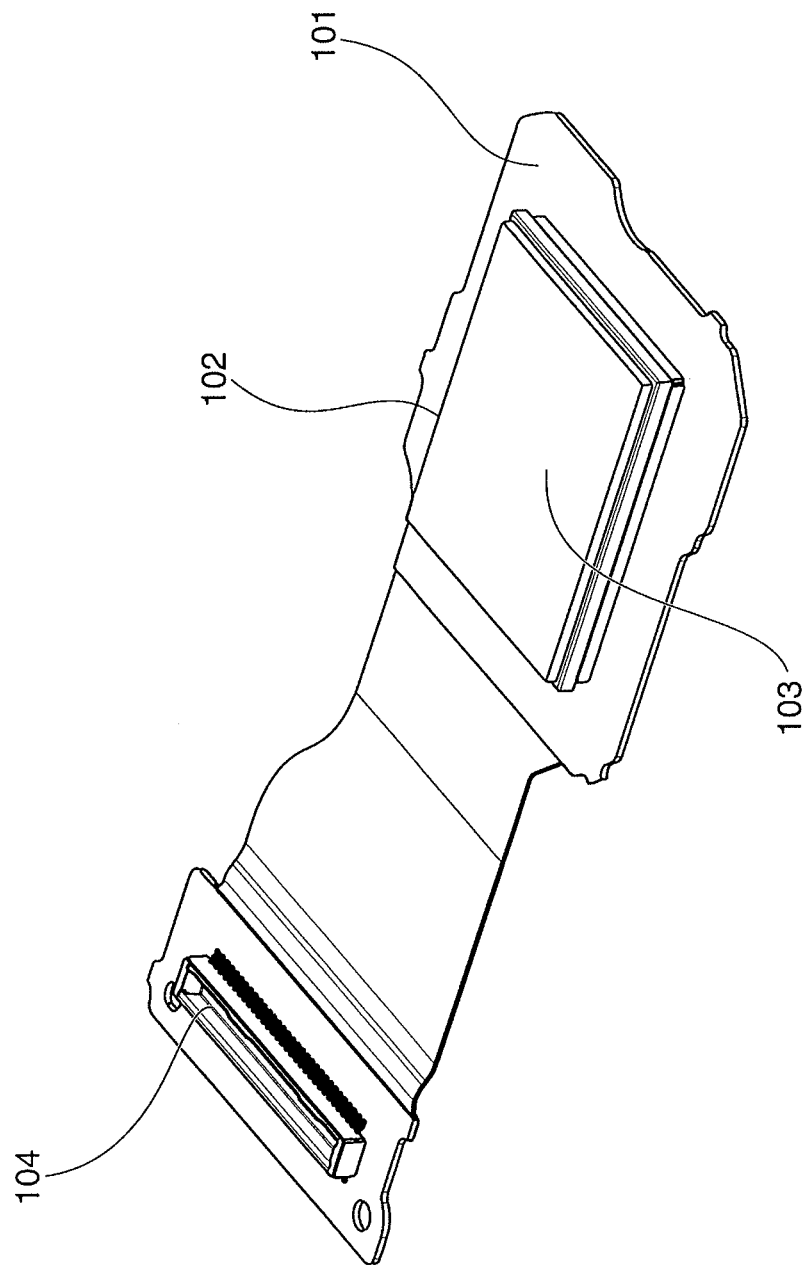
FIG. 1 is a perspective view showing an overall construction of a circuit substrate according to an embodiment of the invention.

FIG. 1 is a perspective view showing an overall construction of the circuit substrate 101 according to the embodiment of the invention. An IC 102 and a connector 104 are mounted on the circuit substrate 101. The IC 102 is an image pickup sensor (photoelectric conversion device) such as a CMOS sensor or a CCD sensor which performs electronic conversion to generate an image signal from light projected on a light-incident surface 103. The IC 102, however, is not limited to the image pickup sensor, but may be, for example, another electronic component such as a transistor or a resistor.

It should be noted that examples of an electronic device on which an image pickup sensor is mounted include a digital still camera, a digital video camera, a mobile communication terminal with a camera, and a game machine with a camera, but the electronic device is not limited to them.

The IC 102 is electrically connected to the circuit substrate 101 via solder by surface-mounting. An image signal generated by the IC 102 is transmitted to the connector 104, which is disposed on the circuit substrate, via a wiring pattern, not shown, on the circuit substrate 101 and further transmitted from the connector 104 to another circuit substrate, not shown, to which the connector 104 is connected. In the other circuit, data processing such as generation of image data from the received image signal is performed.

Figure 2A:
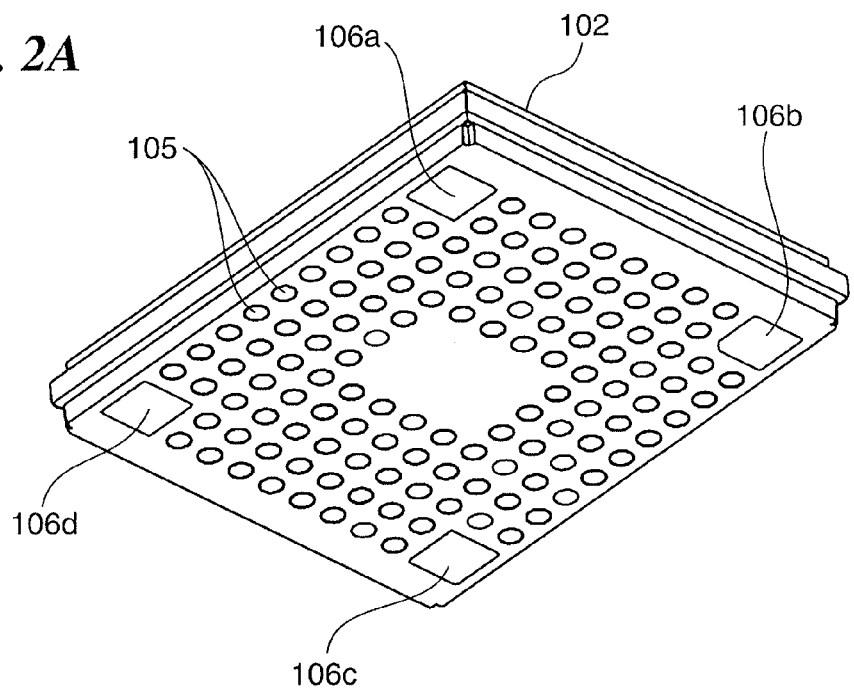
FIG. 2A is a perspective view showing an IC alone before it is surface-mounted on the circuit substrate in FIG. 1.
Figure 2B:
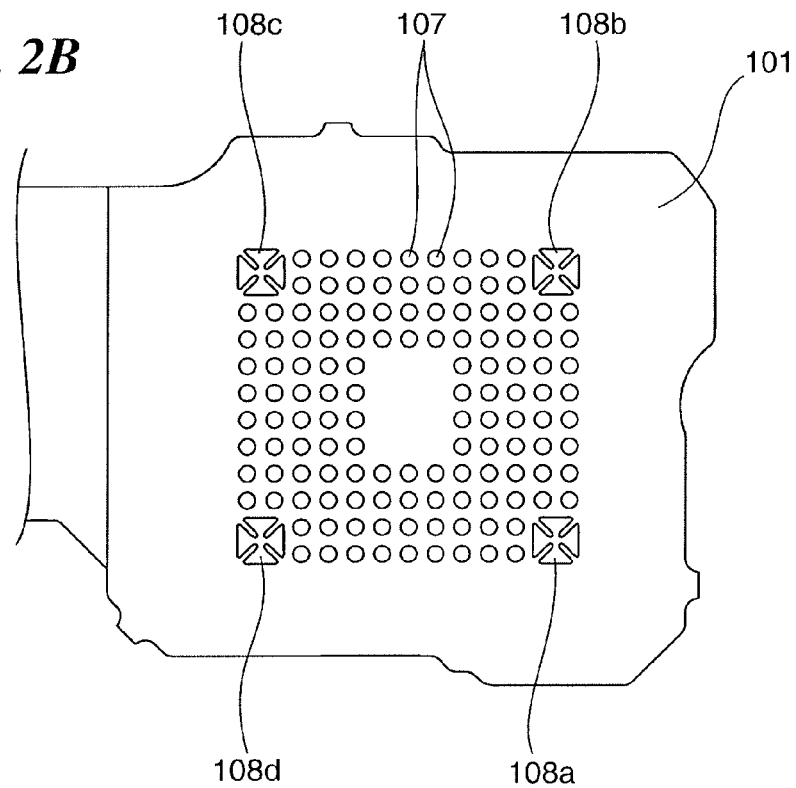
FIG. 2B is a plan view showing a part of the circuit substrate in FIG. 1, on which the IC is to be mounted, before the IC is surface-mounted on the circuit substrate.

FIG. 2A is a perspective view showing the IC 102 alone before it is surface-mounted on the circuit substrate 101, and a perspective view showing the IC 102 as viewed from a surface (lower surface) facing the circuit substrate 101 when the IC 102 is mounted on the circuit substrate 101. FIG. 2B is an enlarged plan view showing a part of the circuit substrate 101, on which the IC 102 is to be mounted, before the IC 102 is surface-mounted on the circuit substrate 101.

Referring to FIG. 2A, multiple signal terminals 105 which are mounting terminals, and reinforcing terminals 106a, 106b, 106c, and 106d are provided on the lower surface of the IC 102. The signal terminals 105 are mounting terminals corresponding to various signals such as signals generated by the IC 102 and power-supply signals supplied to drive the IC 102, and they are circular as shown in FIG. 2A. On the other hand, the reinforcing terminals 106a to 106d provided in respective corners of the IC 102 are mounting terminals provided so as to improve the reliability of connection between the circuit substrate 101 and the IC 102 when the IC 102 is surface-mounted on the circuit substrate 101. Accordingly, the area of each of the reinforcing terminals 106a to 106d is larger than the area of each of the multiple signal terminals 105.

Referring to FIG. 2B, multiple signal terminal mounting lands 107 corresponding to the positions of the signal terminals 105, and reinforcing terminal mounting lands 108a, 108b, 108c, and 108d corresponding to the positions of the reinforcing terminals 106a to 106d are provided on the circuit substrate 101. The signal terminal mounting lands 107 have a circular shape corresponding to the shape of the signal terminals 105. The reinforcing terminal mounting lands 108a, 108b, 108c and 108d have a shape corresponding to a shape of the reinforcing terminals 106a to 106d. The signal terminals 105 and the signal terminal mounting lands 107 are connected together, and the reinforcing terminals 106a to 106d and the reinforcing terminal mounting lands 108a, 108b, 108c and 108d are connected together by soldering. As a result, the IC 102 is mechanically fixed to the circuit substrate 101, and at the same time, required electrical connection is established.

As described earlier, the area of each of the reinforcing terminals 106a to 106d is larger than the area of each of the multiple signal terminals 105. For this reason, solder voids tend to be formed during surface-mounting in solder that connects the reinforcing terminals 106a to 106d to the reinforcing terminal mounting lands 108a, 108b, 108c, and 108d. To solve this problem, openings of the reinforcing terminal mounting lands 108a, 108b, 108c, and 108d have a characteristic shape. A detailed description will now be given of the reinforcing terminal mounting lands 108a, 108b, 108c, and 108d.

In general, a mounting land is comprised of a copper foil pad which is a wiring layer, and a solder resist formed on surface wiring. The mounting land is formed by coating the copper foil pad with the solder resist such that the solder resist covers the entire copper foil pad, and then removing the solder resist so as to expose a necessary area of the copper foil pad. It should be noted that for the mounting land, a pad made of another conductive material may be used in place of the copper foil pad. The solder resist is a coating of an insulating material formed on a circuit substrate so that only a pattern of the copper foil pad or the like in an area required to be soldered, and solder is not attached to an area not required to be soldered.

In general, to form a mounting land, there are two methods called SMD and NSMD. SMD is a method that removes the solder resist such that at least part of the copper foil pad is not exposed, and an opening formed of a solder resist removed area corresponds to a shape of the mounting land. On the other hand, NSMD is a method that removes the solder resist to expose the entire copper foil pad, and an opening formed of a solder resist removed area is greater than the copper foil pad, and hence a shape of the copper foil pad corresponds to a shape of the mounting land.

In the following description, because all the reinforcing terminal mounting lands 108a to 108d are formed by SMD, and the reinforcing terminal mounting lands 108a to 108d have the same construction, a description will be given of only the reinforcing terminal mounting land 108a.

Figure 3A:
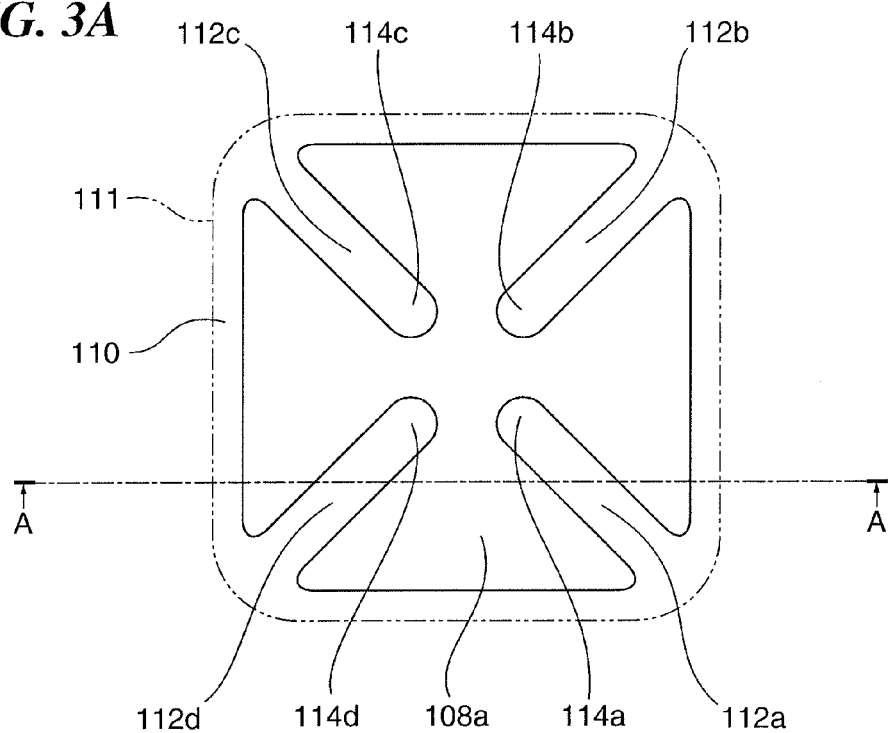
FIG. 3A is an enlarged plan view showing a reinforcing terminal mounting land formed on the circuit substrate in FIG. 1.
Figure 3B:
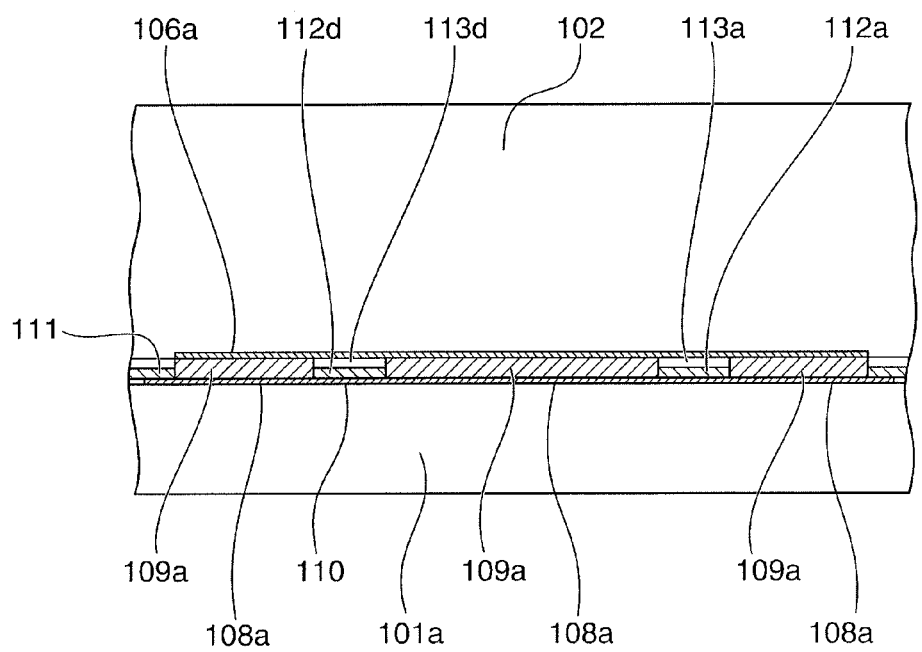
FIG. 3B is a cross-sectional view taken in the direction of an arrow A-A in the enlarged plan view of FIG. 3A.

FIG. 3A is an enlarged plan view showing the reinforcing terminal mounting land 108a, and FIG. 3B is a cross-sectional view taken in the direction of an arrow A-A in FIG. 3A. It should be noted that FIG. 3B shows a state where the reinforcing terminal 106a of the IC 102, not shown in FIG. 3A, is mounted on the reinforcing terminal mounting land 108a by solder 109a.

Referring to FIGS. 3A and 3B, a copper foil pad 111 is formed on a base material 101a of the circuit substrate 101, and a part of the copper foil pad 111 which is not covered with a solder resist 110 is the reinforcing terminal mounting land 108a. It should be noted that the copper foil pad 111 is connected to a ground signal line by a wiring pattern, not shown. The reinforcing terminal mounting land 108a includes resist tongue portions 112a, 112b, 112c, and 112d as protruding portions which are tongue-like portions of a solder resist remaining on the copper foil pad 111 without being removed. It should be noted that the resist tongue portions 112a, 112b, 112c, and 112d are formed integrally with the solder resist 110, and hence they are also part of the solder resist 110. The resist tongue portions 112a to 112d are formed so as to protrude from an outer side of the reinforcing terminal mounting land 108a to an inner side of the reinforcing terminal mounting land 108a.

Referring now to FIG. 3B, a description will be given of effects of the resist tongue portions 112a to 112d. In the copper foil pad 111, the reinforcing terminal mounting land 108a and the reinforcing terminal 106a, which are areas uncovered with the solder resist 110, are mechanically connected and fixed together by the solder 109a, and at the same time, electrical connection is established. Referring to the cross-section of FIG. 3B, the solder 109a is not present continuously from the copper foil pad 111 with respect to the reinforcing terminal 106a, and there are spaces 113a and 113d above the resist tongue portions 112a and 112d, respectively.

The spaces 113a and 113d act as escape routes for gas generated by vaporization of a flux component contained in the solder when the IC 102 is mounted on the circuit substrate 101 by surface-mounting, and this enables the generated gas to go out of the solder. Namely, the spaces 113a and 113d formed by providing the resist tongue portions 112a and 112d can reduce the formation of solder voids. It goes without saying that the resist tongue portions 112b and 112c in FIG. 3A play the same role as the resist tongue portions 112a and 112d do.

In the present embodiment, as shown in FIG. 3A, resist tongue leading end portions 114a, 114b, 114c, and 114d of the resist tongue portions 112a, 112b, 112c, and 112d are not connected together. As a result, the reinforcing terminal mounting land 108a is formed as one area which is not separated but is continuous. Here, assuming that the resist tongue leading end portions 114a to 114d are in communication with one another, and the reinforcing terminal mounting land 108a is divided into a plurality of areas, a problem described hereafter will arise.

When solder is printed on a copper foil pad, the printed solder may not be uniform in thickness. Also, when an electronic component is mounted on a circuit substrate after printing of solder, the electronic component may not be parallel with the circuit substrate, or the electronic component and the circuit substrate may become misaligned. In this case, the solder may go to a part (one side) in a reinforcing terminal mounting land. At this time, if the reinforcing terminal mounting land is divided into a plurality of land areas, the amount of solder in the separate land areas is uneven, and depending on conditions, there may be a land area where there is no solder. As a result, the separate land areas may vary in joint strength, and the reinforcing terminal mounting land as a whole may not have satisfactory joint strength. In a land area where there is only a small amount of solder, electric resistance is high due to unsatisfactory connection with a reinforcing terminal, and there is fear that the reliability of electric connection may decrease.

Here, to reduce solder voids, a method called shift mounting may be used. In shift mounting, the position at which an electronic component is mounted on a circuit substrate after printing of a solder is shifted on purpose during surface-mounting, and the electronic component is self-aligned using surface tension of the solder brings the electronic component to a correct mounting position.

Shift mounting, however, has a problem that solder tends to go to one side. For this reason, when a reinforcing terminal mounting land is divided into a plurality of land areas, solder which goes to one side once cannot go back across solder resist walls, and a phenomenon in which the amount of solder in the land areas becomes uneven significantly occurs. Therefore, shift mounting in the case where a reinforcing terminal mounting land is divided into a plurality of land areas may degrade connection reliability.

On the other hand, in the present embodiment, the reinforcing terminal mounting land 108a is formed as one land area without being divided, the problem described above can be avoided. The reason for this will be described in further detail with reference to FIGS. 4A and 4B.

Figure 4A:
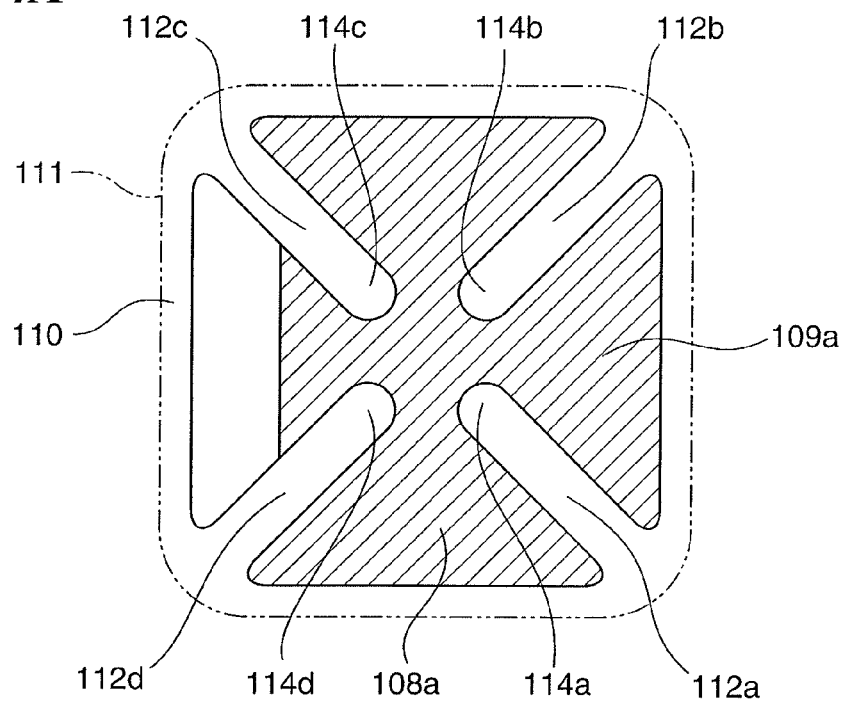
FIG. 4A is a view showing in schematic form a state of soldering on the reinforcing terminal mounting land in FIG. 3A.
Figure 4B:
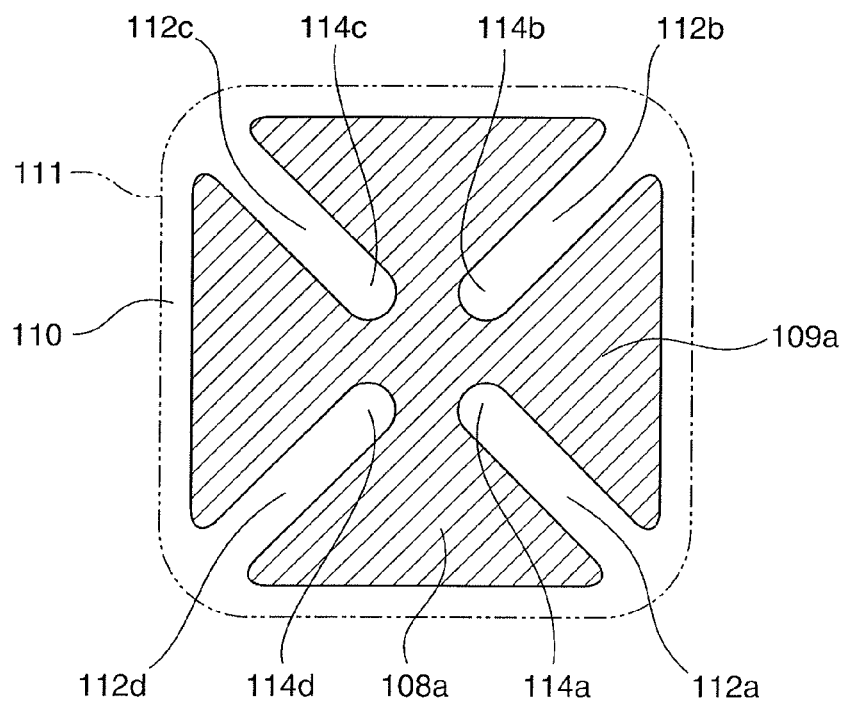
FIG. 4B is a view showing in schematic form a state of soldering on the reinforcing terminal mounting land in FIG. 3A.

FIGS. 4A and 4B are views showing in schematic form a state of the solder 109a on the reinforcing terminal mounting land 108a. FIG. 4A shows a state where the solder 109a (indicated by hatch lines in FIG. 4A) has gone to one side once inside the reinforcing terminal mounting land 108a. The reinforcing terminal mounting land 108a, however, is not divided into a plurality of land areas. Thus, the solder 109a can evenly spread over the entire reinforcing terminal mounting land 108a due to surface tension of the solder 109a, and hence as shown in FIG. 4B, the solder 109a can be evenly distributed over the entire reinforcing terminal mounting land 108a.

Therefore, according to the present embodiment, the amount of solder 109a can be prevented from being uneven inside the reinforcing terminal mounting land 108a, and as a result, a decrease in the reliability of joining with solder can be prevented. Moreover, shift mounting is made possible, and due to the effect of the resist tongue portions 112a to 112d and the effect of shift mounting, solder voids can be reduced in an effective manner.

It is preferred that the resist tongue portions 112a to 112d are formed so as not to cross any of extensions of the other resist tongue portions. The reason for this will be described with reference to FIG. 5.

Figure 5:
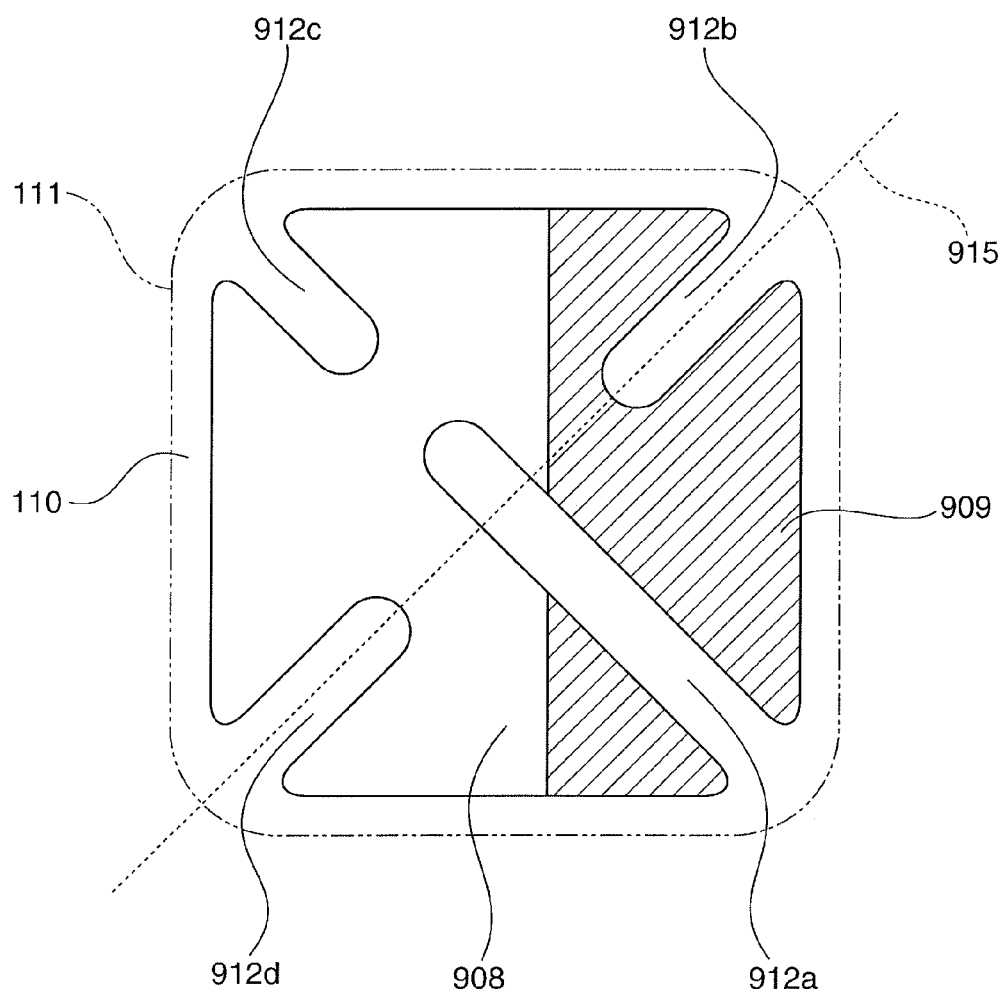
FIG. 5 is a plan view showing a reinforcing terminal mounting land according to a reference example.

FIG. 5 is a plan view showing a reinforcing terminal mounting land 908 according to a reference example. A solder resist and a copper foil pad of the reinforcing terminal mounting land 908 are identical in terms of construction with the solder resist 110 and the copper foil pad 111 of the reinforcing terminal mounting land 108a according to the present embodiment, and in FIG. 5, they are designated by the same reference numerals. A part of the copper foil pad 111 which is not covered with the solder resist 110 is the reinforcing terminal mounting land 908.

The reinforcing terminal mounting land 908 includes resist tongue portions 912a, 912b, 912c, and 912d which are tongue-like portions of a solder resist 110 remaining on the copper-foil pad 111 without being removed. It should be noted that the resist tongue portions 912a, 912b, 912c, and 912d are formed integrally with the solder resist 110, and hence they are also part of the solder resist 110. As with FIG. 4, the solder 909 is indicated by hatch lines in FIG. 5.

The resist tongue portion 912a is provided so as to extend from an outer peripheral portion of the reinforcing terminal mounting land 908 into the area of the reinforcing terminal mounting land 908. In the present embodiment, the resist tongue portion 912a is provided to extend from one corner of the reinforcing terminal mounting land 908 toward the resist tongue portion 912c, which is located at a diagonal position, through the center of the reinforcing terminal mounting land 908. The resist tongue portion 912a crosses an extension 915 parallel with longitudinal directions of the resist tongue portions 912b and 912d located at other diagonal positions on the reinforcing terminal mounting land 908.

With this construction, when solder 909 leans to the right side as shown in FIG. 5, the solder 909 may not satisfactorily and evenly spread toward the left side due to an obstacle which is the resist tongue portion 912a even if the solder 909 tries to spread toward the left side by surface tension.

Therefore, as shown in FIG. 3A, it is preferred that the resist tongue portions 112a, 112b, 112c, and 112d provided in the reinforcing terminal mounting land 108a are formed in such a manner as not to cross any of extensions of the other resist tongue portions, and this enables the solder 109 to satisfactorily and evenly spread. However, the reinforcing terminal mounting land 908 configured in form to have the resist tongue portions 912a, 912b, 912c, and 912d is effective for the purpose of reducing solder voids.

It should be noted that in the reinforcing terminal mounting land 108a, an area where gas generated inside the solder 109a resists escaping most is the farthest area from an outer periphery of the reinforcing terminal mounting land 108a, that is, an area near the center of the reinforcing terminal mounting land 108a. For this reason, generated gas can be effectively let out when the resist tongue portions 112a, 112b, 112c, and 112d are provided to extend toward substantially the center of the reinforcing terminal mounting land 108a as a path for letting the gas generated in the area near the center of the reinforcing terminal mounting land 108a out. Namely, it is preferred that the resist tongue portions 112a, 112b, 112c, and 112d are designed to extend toward substantially the center of the reinforcing terminal mounting land 108a.

As described above, the reinforcing terminal mounting lands 108a to 108d provided on the circuit substrate 101 according to the present embodiment can reduce formation of solder voids in the reinforcing terminal mounting lands 108a to 108d. Moreover, in each of the reinforcing terminal mounting lands 108a to 108d, the solder 109a can be prevented from being unevenly distributed. As a result, the reliability of mechanical connection and electric connection between the reinforcing terminals 106a to 106d and the reinforcing terminal mounting lands 108a to 108d can be improved.

Figure 6A:
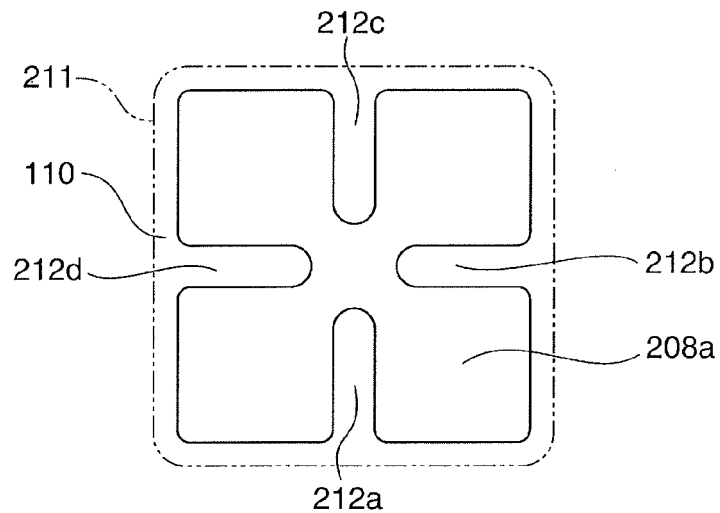
FIG. 6A is a plan view showing a first variation of the reinforcing terminal mounting land in FIG. 3A.
Figure 6B:
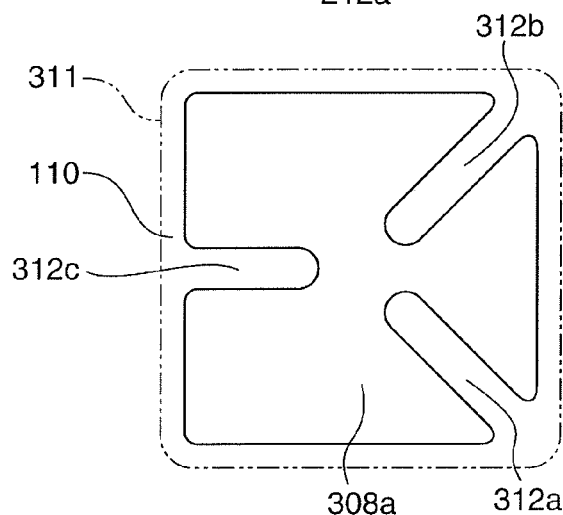
FIG. 6B is a plan view showing a second variation of the reinforcing terminal mounting land in FIG. 3A.
Figure 6C:
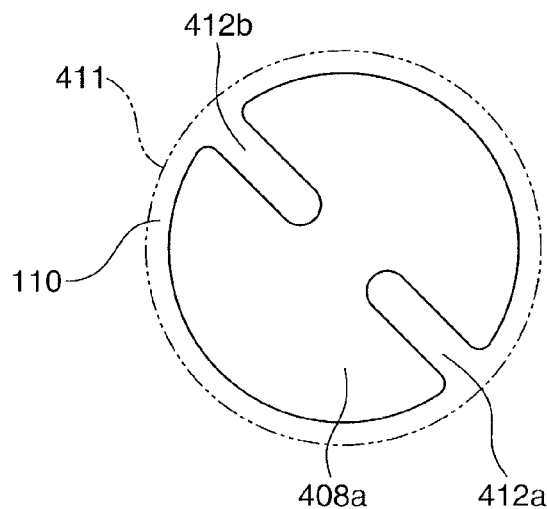
FIG. 6C is a plan view showing a third variation of the reinforcing terminal mounting land in FIG. 3A.

A description will now be of variations of the reinforcing terminal mounting land 108a. FIGS. 6A, 6B, and 6C are plan views showing reinforcing terminal mounting lands 208a, 308a, and 408a, respectively, according to first, second, and third variations of the reinforcing terminal mounting land 108a. Constructions of the solder resist 110 and copper foil pads 211, 311, and 411 (the constructions shown in FIG. 3B) constituting the reinforcing terminal mounting lands 208a, 308a, and 408a are the same as the constructions of the solder resist 110 and the copper foil pad 111 constituting the reinforcing terminal mounting land 108a described above.

Referring to FIG. 6A, a part of the copper foil pad 211 which is not covered with the solder resist 110 is the reinforcing terminal mounting land 208a. The reinforcing terminal mounting land 208a includes resist tongue portions 212a, 212b, 212c, and 212d which are formed by the solder resist 110 remaining in tongue shape on the copper-foil pad 211 without being removed. It should be noted that the resist tongue portions 212a to 212d are formed integrally with the solder resist 110, and hence they are also part of the solder resist 110.

In the reinforcing terminal mounting land 108a (see FIG. 3A) described earlier, the resist tongue portions 112a to 112d are extended from the corners of the reinforcing terminal mounting land 108a toward the center of the reinforcing terminal mounting land 108a. On the other hand, in the reinforcing terminal mounting land 208a shown in FIG. 6A, the resist tongue portions 212a to 212d are extended from substantially the centers of sides of the reinforcing terminal mounting land 208a toward the center of the reinforcing terminal mounting land 208a.

Referring to FIG. 6B, a part of the copper foil pad 311 which is not covered with the solder resist 110 is the reinforcing terminal mounting land 308a. The reinforcing terminal mounting land 308a includes resist tongue portions 312a, 312b, and 312c which are formed by the solder resist 110 remaining in tongue shape on the copper-foil pad 311 without being removed. It should be noted that the resist tongue portions 312a to 312c are formed integrally with the solder resist 110, and hence they are also part of the solder resist 110.

The reinforcing terminal mounting land 108a (see FIG. 3A) described earlier is configured to have the four resist tongue portions 112a to 112d. On the other hand, the reinforcing terminal mounting land 308a shown in FIG. 6B is configured to have the three resist tongue portions 312a to 312c. According to the invention, the number of resist tongue portions provided in a reinforcing terminal mounting land is not limited but has only to be at least one so as to obtain the effect of reducing solder voids. However, the greater the number of resist tongue portions, the smaller the area of a reinforcing terminal mounting land on which solder is actually put. Thus, there is fear that mechanical connection strength will decrease, and electric resistance will increase, and hence it is preferred that the number, width, and length of resist tongue portions are determined within a scope which does not present such problems.

Referring to FIG. 6C, a part of the copper foil pad 411 which is not covered with the solder resist 110 is the reinforcing terminal mounting land 408a. The reinforcing terminal mounting land 408a includes resist tongue portions 412a and 412b which are formed by the solder resist 110 remaining in tongue shape on the copper-foil pad 411 without being removed. It should be noted that the resist tongue portions 412a and 412b are formed integrally with the solder resist 110, and hence they are also part of the solder resist 110.

The reinforcing terminal mounting land 108a (see FIG. 3A) described earlier has a substantially quadrangular shape and has the four resist tongue portions 112a to 112d. On the other hand, in the reinforcing terminal mounting land 408a shown in FIG. 6C, the copper foil pad 411 has a substantially circular shape and has the two resist tongue portions 412a and 412b. It should be noted that according to the invention, the shape of a reinforcing terminal mounting land is not particularly limited, but may be arbitrarily determined according to, for example, the shape of reinforcing terminals of an electronic component mounted on a circuit substrate, and may have, for example, a triangular or any other polygonal shape, an elliptical shape, or an oval shape. It should be noted that as a matter of course, the number of resist tongue portions provided in the reinforcing terminal mounting land 408a is not limited to two, but may be three or more, and conversely, one. The reinforcing terminal mounting lands 208a, 308a, and 408a shown in FIGS. 6A, 6B, and 6C as well can obtain the same effects as those obtained by the reinforcing terminal mounting land 108a.

The invention is not limited to the embodiments described above, but various changes in or to the above described embodiment may be possible without departing from the spirits of the invention. Further, the embodiments described above represent illustrative embodiments of the invention, and the embodiments may be combined as appropriate.

For example, although in the embodiments described above, a mounting land is formed by SMD, a mounting land may be formed by NSMD, and in a mounting land formed by NSMD as well, a copper foil pad in an area corresponding to a resist tongue portion is not exposed. Moreover, although in the embodiments described above, a copper foil pad is connected to a ground signal line by a wiring pattern, not shown, a copper foil pad may be continuously from and integrally with a copper foil surface of a ground signal line. Further, a copper foil pad may not be connected to any other signal lines, and may be connected to any signal line other than a ground signal line. Further, although in the embodiments described above, a reinforcing terminal mounting land provided on a circuit substrate is taken as an example, the form of a mounting land which characterizes the invention may be applied to a signal terminal mounting land as well.

Other Embodiments

While the invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-166262 filed Aug. 9, 2013, which is hereby incorporated by reference herein in its entirety.

What is claimed is:

1. A circuit substrate on which an electronic component having a mounting terminal and a signal terminal is mounted, comprising:
a first mounting land configured to be connected to the mounting terminal by soldering; and
a second mounting land configured to be connected to the signal terminal by soldering,
wherein the first mounting land has a larger area than the second mounting land so as to increase reliability of connection between the circuit substrate and the electronic component when the electronic component is mounted on the circuit substrate,
wherein said first mounting land is provided with a protruding portion of an insulating material formed so as to protrude from an outer side of said first mounting land toward an inner side of said first mounting land,
wherein the protruding portion does not divide said first mounting land into a plurality of areas, and
wherein said second mounting land is not provided with the protruding portion.

2. The circuit substrate according to claim 1, wherein the insulating material is a solder resist provided on surface wiring of the circuit substrate.

3. The circuit substrate according to claim 1, wherein the protruding portion is formed so as to protrude toward substantially a center of said first mounting land.

4. The circuit substrate according to claim 1, wherein said first mounting land is provided with a plurality of protruding portions, and the plurality of protruding portions is formed so as not to cross extensions of the protrusions.

5. The circuit substrate according to claim 1, wherein:
the circuit substrate includes a central area and a peripheral area disposed around the central area, and
the first mounting land is disposed in the peripheral area of the circuit substrate and the second mounting land is disposed in the central area of the circuit substrate.

6. The circuit substrate according to claim 1, wherein the protruding portion includes a plurality of tongue portions, each of the tongue portions extending from the outer side of the first mounting land toward the inner side of the first mounting land.

7. The circuit substrate according to claim 6, wherein one of the plurality of tongue portions is greater in length than another one of the plurality of the tongue portions.

8. The circuit substrate according to claim 7, wherein the protruding portion has a substantially quadrangular periphery and each tongue portion extends diagonally from a corner of the periphery toward the inner side of the first mounting land.

9. The circuit substrate according to claim 7, wherein the protruding portion has a substantially quadrangular periphery and the plurality of tongue portions include a first tongue portion extends diagonally from a corner of the periphery toward the inner side of the first mounting land and a second tongue portion extending from a side of the periphery toward the inner side of the first mounting land.

10. The circuit substrate according to claim 9, wherein a length of the first tongue portion is greater than a length of the second tongue portion.

11. An electronic device having a circuit substrate on which an electronic component is mounted, the circuit substrate comprising a first mounting land configured to be connected to a mounting terminal of the electronic component by soldering and a second mounting land configured to be connected to a signal terminal of the electronic component by soldering,
wherein the first mounting land has a larger area than the second mounting land so as to increase reliability of connection between the circuit substrate and the electronic component,
wherein the first mounting land is provided with a protruding portion of an insulating material formed so as to protrude from an outer side of the first mounting land toward an inner the of the first mounting land,
wherein the protruding portion does not divide the first mounting land into a plurality of areas, and
wherein the second mounting land is not provided with the protruding portion.

12. The electronic device according to claim 11, wherein the insulating material is a solder resist provided on surface wiring of the circuit substrate.

13. The electronic device according to claim 11, wherein the protruding portion is formed so as to protrude toward substantially a center of the first mounting land.

14. The electronic device according to claim 11, wherein:
the circuit substrate includes a central area and a peripheral area disposed around the central area, and
the first mounting land is disposed in the peripheral area of the circuit substrate and the second mounting land is disposed in the central area of the circuit substrate.

15. The electronic device according to claim 11, wherein the protruding portion includes a plurality of tongue portions, each of the tongue portions extending from the outer side of the first mounting land toward the inner side of the first mounting land.

16. The electronic device according to claim 15, wherein one of the plurality of tongue portions is greater in length than another one of the plurality of the tongue portions.

17. The electronic device according to claim 16, wherein the protruding portion has a substantially quadrangular periphery and each tongue portion extends diagonally from a corner of the periphery toward the inner side of the first mounting land.

18. The electronic device according to claim 16, wherein the protruding portion has a substantially quadrangular periphery and the plurality of tongue portions include a first tongue portion extends diagonally from a corner of the periphery toward the inner side of the first mounting land and a second tongue portion extending from a side of the periphery toward the inner side of the first mounting land.

19. The electronic device according to claim 18, wherein a length of the first tongue portion is greater than a length of the second tongue portion.

\* \* \* \* \*